United States Patent
Hersel et al.

(10) Patent No.: US 6,671,152 B1
(45) Date of Patent: Dec. 30, 2003

(54) POWER MOS TRANSISTOR WITH OVERTEMPERATURE PROTECTION CIRCUIT

(75) Inventors: Walter Hersel, Leonberg (DE); Wolfram Breitling, Sachsenheim (DE); Reinhold Weible, Stuttgart (DE); Rolf Falliano, Rudersberg-Steinenberg (DE)

(73) Assignee: GKR Gesellschaft fur Fahrzeugklimaregelung mbH, Schwieberdingen (DE)

(*) Notice: Subject to any disclaimer, the term of this patent is extended or adjusted under 35 U.S.C. 154(b) by 0 days.

(21) Appl. No.: 09/700,482

(22) PCT Filed: May 7, 1999

(86) PCT No.: PCT/DE99/01378

§ 371 (c)(1),
(2), (4) Date: Jan. 5, 2001

(87) PCT Pub. No.: WO99/60628

PCT Pub. Date: Nov. 25, 1999

(30) Foreign Application Priority Data

May 15, 1998 (DE) .......................................... 198 21 834

(51) Int. Cl.[7] .................................................. H02H 5/04
(52) U.S. Cl. ...................... 361/93.8; 361/103; 327/378
(58) Field of Search ................................ 361/93.8, 103; 327/378; 257/467

(56) References Cited

U.S. PATENT DOCUMENTS

| 5,063,307 A | * 11/1991 | Zommer .................. 327/512 |
| 5,304,837 A | 4/1994 | Hierold |
| 5,457,419 A | * 10/1995 | Tihanyi .................. 327/378 |
| 5,555,152 A | * 9/1996 | Brauchle et al. ........... 361/103 |
| 5,726,481 A | 3/1998 | Moody |

FOREIGN PATENT DOCUMENTS

| EP | 0 565 807 | 10/1993 |
| JP | 01 047 077 | 2/1989 |
| WO | WO 98 06 142 | 2/1998 |

* cited by examiner

Primary Examiner—Brian Sircus
Assistant Examiner—James Demakis
(74) Attorney, Agent, or Firm—Kenyon & Kenyon

(57) ABSTRACT

A power MOS transistor having a PMT chip located in a transistor housing in which the temperature of the transistor barrier junction is monitored is described. Protection of the PMT chip against overload and permanent damage is guaranteed without negatively affecting its switching function in that a protective circuit is provided in the transistor housing which directly measures the temperature of the transistor barrier junction using a temperature measuring element, and when a predefined or predefinable limit barrier junction temperature is reached reduces the drain current and thus the power loss of the PMT chip, the temperature measuring element being integrated in the PMT chip or accommodated in the transistor housing together with the protective circuit as an additional chip.

2 Claims, 2 Drawing Sheets

POWER MOS TRANSISTOR WITH OVERTEMPERATURE PROTECTION CIRCUIT

FIELD OF THE INVENTION

The present invention relates to a power MOS transistor having a PMT chip located in a transistor housing in which the temperature of the transistor barrier junction is monitored.

BACKGROUND INFORMATION

In using a power MOS transistor, the problem arises that, depending on the power loss in the PMT chip, the temperature of the transistor barrier junction increases with respect to the ambient temperature. Since the maximum allowed barrier junction temperature of semiconductors is limited, in each individual case this maximum allowed barrier junction temperature is not to be exceeded.

Different methods are known to achieve this purpose depending on the type of application of the power MOS transistor. Thus for example in fan controllers a plurality of power MOS transistors are usually connected in parallel and attached to a heat sink to dissipate the heat. The heat generated by the previous load in the PMT chip is conducted from the transistor barrier junction to the heat sink and released into the surrounding atmosphere. The barrier junction temperature is determined from the heat sink temperature and the instantaneous power loss, and the maximum power loss is limited using an additional protective circuit.

This method has several disadvantages, Thus, a temperature difference which depends on the power loss generated by the PMT chip appears between the point of measurement and the transistor barrier junction. There is a time difference between the temperature of the barrier junction and the measuring point due to the mass of the heat sink.

In the case of defective assembly of the power MOS transistor on the heat sink, for example, with dirt between the transistor cooling fin and the heat sink, the measured barrier junction temperature is lower than the actual barrier junction temperature, so that the power MOS transistor may be permanently damaged. In order to prevent this from happening, the PMT chip itself and the protective circuit must be overdimensioned.

It has also been attempted to measure the barrier junction temperature directly on the transistor barrier junction and to respond to this measured temperature directly. In this case a temperature threshold is defined in the protective circuit, at which the drain current of the power MOS transistor is switched off. The drain current may be switched off immediately (OMNIFET) or with a time delay (HITFET) in order to avoid an overload and prevent the power MOS transistor from being permanently damaged.

SUMMARY OF THE INVENTION

An object of the present invention is to provide a power MOS transistor which is protected against overload and permanent damage without overdimensioning the PMT chip and without negatively affecting its switching response.

This object is achieved according to the present invention by the fact that a protective circuit is provided in the transistor housing which directly measures the temperature of the transistor barrier junction using a temperature measuring element, and when a predefined or predefinable limit barrier junction temperature is reached reduces the drain current and thus the power loss of the PMT chip, the temperature measuring element being integrated in the PMT chip or accommodated in the transistor housing together with the protective circuit of the additional chip.

With this protective circuit, a constant maximum barrier junction temperature is provided which corresponds to the limit barrier junction temperature. As long as the barrier junction temperature in the PMT chip is lower than the limit barrier junction temperature, the protective circuit has a negligible effect on the switching response of the power MOS transistor.

Since the drain current is not shut off but only reduced when the limit barrier junction temperature is reached, no reconnection is needed with the power MOS transistor according to the present invention. Therefore no expense associated with the known external circuits is incurred.

In applications where the PMT chip attempts to automatically reconnect, oscillations occur which result in system noise or, in other specific applications, in electromagnetic interference. This is also avoided with the power MOS transistor according to the present invention.

The novel power MOS transistor has the additional advantage that in the case of a fault the barrier junction temperature is limited to a constant value. The power is not shut off, but only reduced, which allows emergency operation or, in certain applications, regular operation. Furthermore, in linear and/or clocked applications, a plurality of power MOS transistors of the novel type are directly connected in parallel without the need for additional circuits.

According to one embodiment, a temperature measuring element is mounted on the transistor barrier junction connected upstream from the gate terminal of the PMT chip and forms a voltage divider together with a resistor, so that the gate voltage applied to the gate terminal of the power MOS transistor is reduced as a function of the barrier junction temperature. Using this voltage divider, the gate voltage applied to the gate of the PMT chip is modified, i.e., continuously reduced as a function of the barrier junction temperature. As soon as the PMT chip goes from the saturation range to the active range, the drain current is reduced and thus the PMT chip is prevented from being permanently damaged. The maximum barrier junction temperature that can be reached depends on the gate voltage applied to the power MOS transistor and the threshold voltage of the PMT chip.

The protective circuit can also be designed according to one embodiment so that a temperature measuring element is mounted on the transistor barrier junction, the measured value corresponding to the barrier junction temperature is compared to a predefined or predefinable setpoint value and the voltage at the gate of the PMT chip (PMT) is regulated at a constant barrier junction voltage via an amplifier. The maximum barrier junction temperature is then independent of the gate voltage applied to the power MOS transistor and the threshold voltage of the PMT chip.

If the protective circuit is expanded so that the setpoint value corresponding to the setpoint temperature is derived from the gate voltage applied to the gate of the power MOS transistor, the setpoint temperature can be set through the gate voltage applied to the power MOS transistor and a limit barrier junction temperature can thus be selected.

The barrier junction temperature can be set externally according to another embodiment so that the protective circuit in the transistor housing receives the setpoint value corresponding to the setpoint temperature through a separate terminal leading out of the transistor housing. The power MOS transistor then requires an additional terminal.

External control is also made possible by the fact that the terminals of the temperature measuring element are accessible on the transistor housing as separate terminals.

The internal temperature measuring element can be a silicon-based temperature element which delivers an output signal (e.g., current, voltage, resistance) proportional to the temperature of the transistor barrier junction. It can, however, also be an NTC or PTC resistor.

DETAILED DESCRIPTION

Figure 1:
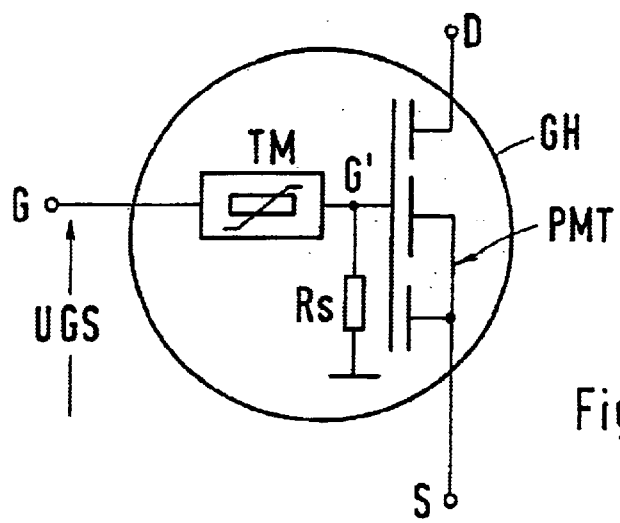
FIG. 1 shows a power MOS transistor having a temperature measuring element in the gate terminal.

In the power MOS transistor illustrated in FIG. 1, three terminals G, D, and S are provided on transistor housing GH, terminals D and S being directly connected to the drain terminal and the source terminal of the PMT chip. Terminal G goes via a temperature measuring element TM to gate terminal G' of the PMT chip to which a resistor Rs is also connected. This resistor Rs forms, together with temperature measuring element TM, a voltage divider which reduces gate voltage UGS applied to terminal G as a function of the prevailing barrier junction temperature, i.e., the temperature of the transistor barrier junction detected by temperature measuring element TM. Thus the voltage at gate terminal G' of the PMT chip is reduced as the barrier junction temperature increases. As soon as the PMT chip goes from the saturation range into the active range, the drain current is reduced, preventing permanent damage to the PMT chip. This embodiment of the power MOS transistor has the advantage that the barrier junction temperature that can be reached depends on voltage UGS applied to gate terminal G and threshold voltage UGS(to) of the PMT chip.

The positions of temperature measuring element TM and resistor Rs may be reversed.

Figure 2:
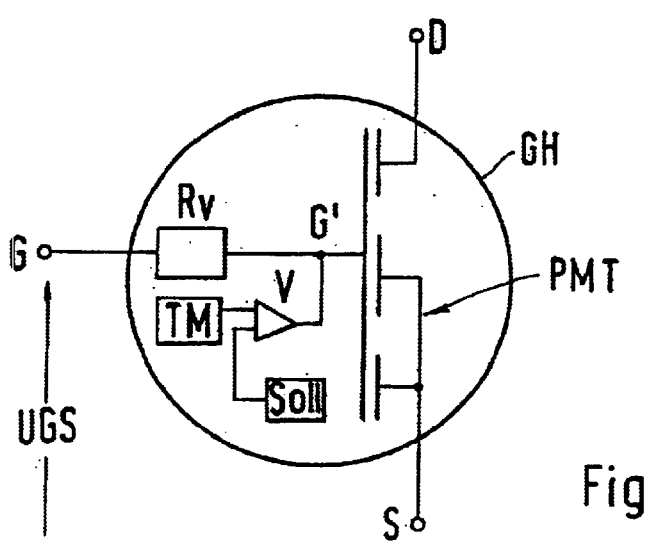
FIG. 2 shows a power MOS transistor featuring a comparison of the barrier junction temperature with a setpoint value.

The power MOS transistor according to FIG. 2 differs from the power MOS transistor according to FIG. 1 by the fact that the barrier junction temperature detected by temperature measuring element TM is compared to a predefined setpoint value. Voltage UGS applied to gate terminal G of the power MOS transistor is applied, via series resistor Rv, to gate terminal G' of the PMT chip. The voltage at gate G' of the PMT chip is regulated by an amplifier V controlled by the measured and setpoint temperature values so that a constant barrier junction temperature is established. This embodiment has the advantage that the maximum barrier junction temperature that can be reached is independent of voltage UGS applied to gate G of the power MOS transistor and of threshold voltage UGS(to) of the PMT chip. However, it requires a more complex circuit.

Figure 3:
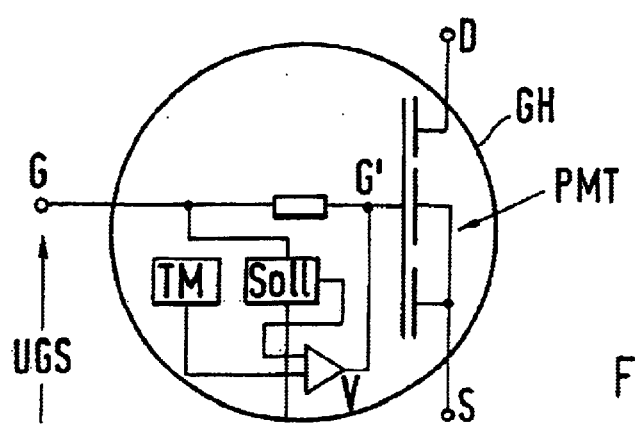
FIG. 3 shows a power MOS transistor similar to that of FIG. 3 in which the setpoint value is derived from the gate voltage.

In the power MOS transistor according to FIG. 3, the setpoint value is derived from voltage UGS applied to gate G of the power MOS transistor. It is therefore possible to predefine the barrier junction setpoint temperature via voltage UGS. The setpoint temperature is a function of voltage UGS, i.e., a limit barrier junction temperature can be defined via voltage UGS. This, however, means that the degree of control of the PMT chip is linked to the setpoint temperature in linear applications.

Figure 3A:
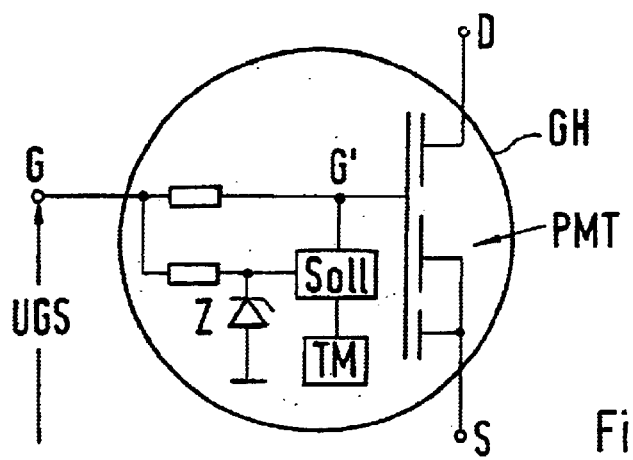
FIG. 3A shows a power MOS transistor having a limiter.

In an embodiment illustrated in FIG. 3A, the maximum allowed temperature of power MOS transistor PMT cannot be exceeded due to the limitation to the maximum setpoint value using limiter Z.

Figure 4:
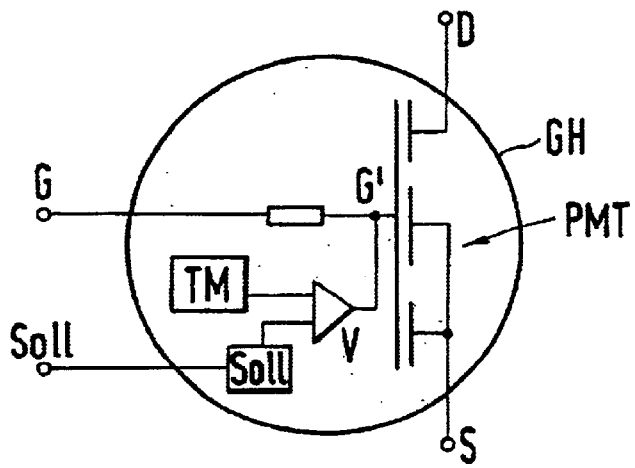
FIG. 4 shows a power MOS transistor similar to that of FIG. 3 in which the setpoint value for the temperature comparison is supplied externally.

The power MOS transistor according to FIG. 4 differs from the power MOS transistor according to FIG. 3 by the fact that the setpoint temperature can be predefined externally via a separate terminal Soll of the power MOS transistor independently of gate voltage UGS. The limit barrier junction temperature can be set externally. This, however, requires a transistor housing having at least four terminals.

Figure 5:
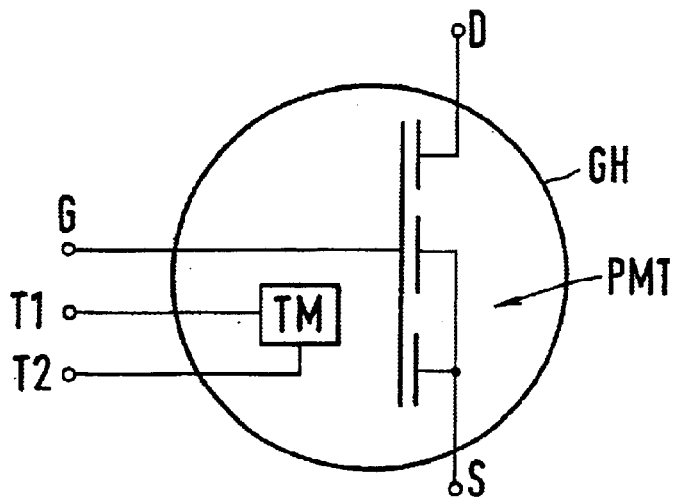
FIG. 5 shows a power MOS transistor in which the terminals of the temperature measuring element lead out of the transistor housing and are accessible from the outside.

The power MOS transistor according to FIG. 5 shows that the terminals of temperature measuring element TM lead out of transistor housing GH as separate terminals and are accessible. Temperature measuring element TM remains in direct contact with the transistor barrier junction and can be integrated in the PMT chip or accommodated in transistor housing GH as a separate chip.

Internal temperature measuring element TM can be an NTC or PTC resistor or a silicon-based temperature element. A signal (e.g., resistance, current, or voltage) proportional to the temperature is obtained between the terminals.

Power MOS transistors according to FIGS. 1 and 2 operate with fixed barrier junction temperatures and are therefore particularly well-suited for applications whose main purpose is to protect the PMT chip.

Power MOS transistors according to FIGS. 3 and 4 are particularly well-suited for applications in which the limit barrier junction temperature is modified, e.g., to narrow the barrier junction temperature differences in power MOS transistors connected in parallel.

The power loss is then distributed via the limit barrier junction temperature. If a power MOS transistor initially assumes the entire power loss due to tolerances, reaching the limit barrier junction temperature, its drain current is reduced. This results in a deviation of the actual value (excessively small voltage) and the external voltage controller increases voltage UGS of the power MOS transistors. A second power MOS transistor then becomes conductive and assumes a portion of the power loss which would result in the first power MOS transistor exceeding the limit barrier junction temperature.

These power MOS transistors according to the present intention can be used with all known protective circuits having current limitation, surge protection and the like and in virtually all applications.

What is claimed is:

1. A power MOS transistor (PMT) device, comprising:
   a transistor housing in which a temperature of a transistor barrier junction is monitored;
   a temperature measuring element;
   a PMT chip located in the transistor housing;
   a protective circuit for directly measuring the temperature of the transistor barrier junction in accordance with an operation of the temperature measuring element and for reducing, without switching off, a drain current in order to reduce a power loss in the PMT chip when. a predefinable limit barrier junction temperature is reached; and an amplifier, wherein:
the temperature measuring element is one of integrated in the PMT chip and arranged in the transistor housing together with the protective circuit as an additional chip,
a measured value corresponding to the temperature of the transistor barrier junction is compared to a predefinable setpoint value, and
a voltage at a gate of the PMT chip is regulated at a constant barrier junction temperature via an amplifier; and wherein terminals of the temperature measuring element are accessible on the transistor housing as separate terminals.

2. A power MOS transistor (PMT) device, comprising:
a transistor housing in which a temperature of a transistor barrier junction is monitored;
a temperature measuring element;
a PMT chip located in the transistor housing;
a protective circuit for directly measuring the temperature of the transistor barrier junction in accordance with an operation of the temperature measuring element and for reducing, without switching off, a drain current in order to reduce a power loss in the PMT chip when a predefinable limit barrier junction temperature is reached; and an amplifier, wherein:
the temperature measuring element is one of integrated in the PMT chip and arranged in the transistor housing together with the protective circuit as an additional chip,
a measured value corresponding to the temperature of the transistor barrier junction is compared to a predefinable setpoint value, and
a voltage at a gate of the PMT chip is regulated at a constant barrier junction temperature via an amplifier; and wherein:
the temperature measuring element includes a silicon-based temperature element, the silicon-based temperature element is adjacent to the transistor barrier junction, and
the silicon-based temperature element delivers a proportional output signal as a function of the temperature of the transistor barrier junction.

* * * * *

UNITED STATES PATENT AND TRADEMARK OFFICE
CERTIFICATE OF CORRECTION

PATENT NO. : 6,671,152 B1
DATED : December 30, 2003
INVENTOR(S) : Walter Hersel et al.

It is certified that error appears in the above-identified patent and that said Letters Patent is hereby corrected as shown below:

<u>Column 1,</u>
Line 45, change "must be" to -- are --.

Signed and Sealed this

Seventeenth Day of August, 2004

JON W. DUDAS
*Acting Director of the United States Patent and Trademark Office*